July 11, 1967 T. R. THOMAS 3,330,971

NOR-NAND LOGIC CIRCUIT USING TUNNEL DIODES

Filed Sept. 23, 1964

INVENTOR.
TEDDY R. THOMAS
BY
S. C. Yeaton
ATTORNEY

United States Patent Office 3,330,971

Patented July 11, 1967

3,330,971

NOR-NAND LOGIC CIRCUIT USING TUNNEL DIODES

Teddy R. Thomas, Dallas, Tex., assignor to Sperry Rand Corporation, Great Neck, N.Y., a corporation of Delaware Filed Sept. 23, 1964, Ser. No. 398,567
12 Claims. (Cl. 307—88.5)

ABSTRACT OF THE DISCLOSURE

Two tunnel diodes are arranged in a known bistable, bias controlled tunnel pair. A bias voltage clamps the bias controlled tunnel pair in its high voltage state unless the bias is overcome by a quiescent voltage from a SET voltage source or by a binary ONE input signal. A nonlinear coupling element provides a low output impedance whenever the bias controlled tunnel pair is in its high voltage state.

This invention relates to digital logic circuits and more particularly to NOR logic circuits employing tunnel diodes.

The prior art teaches the use of a network known as a "bias controlled tunnel pair" in various logic circuits. Such networks have been described by W. N. Carr and A. G. Milnes in an article entitled, "Bias Controlled Tunnel-Pair Logic Circuits," appearing on pages 773–779 of the IRE Transactions on Electronic Computers, volume EC–11 No. 6 for December 1962.

Briefly, these networks contain two tunnel diodes and a resistor arranged in a parallel circuit such that the first tunnel diode alone forms one leg of the circuit whereas the resistor and the second tunnel diode are connected in series with each other and form the second leg of the circuit. Binary input signals are applied to the junction between the resistor and the second tunnel diode. Binary output signals are taken from the anode of the first tunnel diode.

Prior art NOR circuits using such bias controlled tunnel pairs have been developed. These circuits require a source of bucking voltage which must be matched closely to the output voltage of the tunnel diode pair. The precise control required for this bucking voltage necessitates careful adjustment and maintenance. Furthermore, these prior art circuits provide a voltage inversion as well as a logical inversion in that positive-going input signals produce negative-going output signals. Because of this characteristic, auxiliary polarity inversion means must be included between stages of these prior art circuits if two or more stages are to be cascaded.

The number of individual loads that can be energized simultaneously with the prior art circuits is limited because of the impedance of the source of bucking voltage. This limitation on "fan-out" frequently becomes a serious problem when the prior art circuits are to be used in complex computer installations.

The fan-out capabilities of the prior art circuits are also limited because the circuits are inherently sensitive to the load impedance. A large fan-out could prevent proper operation of the circuit. Furthermore, the prior art circuits require relatively large changes in peak current level in response to input signals in order to accommodate load impedance changes.

It is an object of the present invention to provide tunnel diode logic circuits which can be connected in series relationship without the need for intermediate polarity inversion circuits.

It is another object of the present invention to provide tunnel diode logic circuits which do not require precisely controlled bucking voltages.

It is still another object of the present invention to provide tunnel diode logic circuits with high fan-out capabilities.

It is yet another object of the present invention to provide tunnel diode logic circuits that can operate satisfactorily with relatively small changes in peak current level.

These and other objects are achieved by biasing the tunnel diode pair during a cycle so that the peak current level is depressed unless a binary ONE input signal occurs and by providing a nonlinear output coupling means to isolate the load from the NOR circuit unless a binary ONE output signal occurs.

The principles and operation of the invention can be understood by referring to the following description and the accompanying drawings in which.

Figure 1:
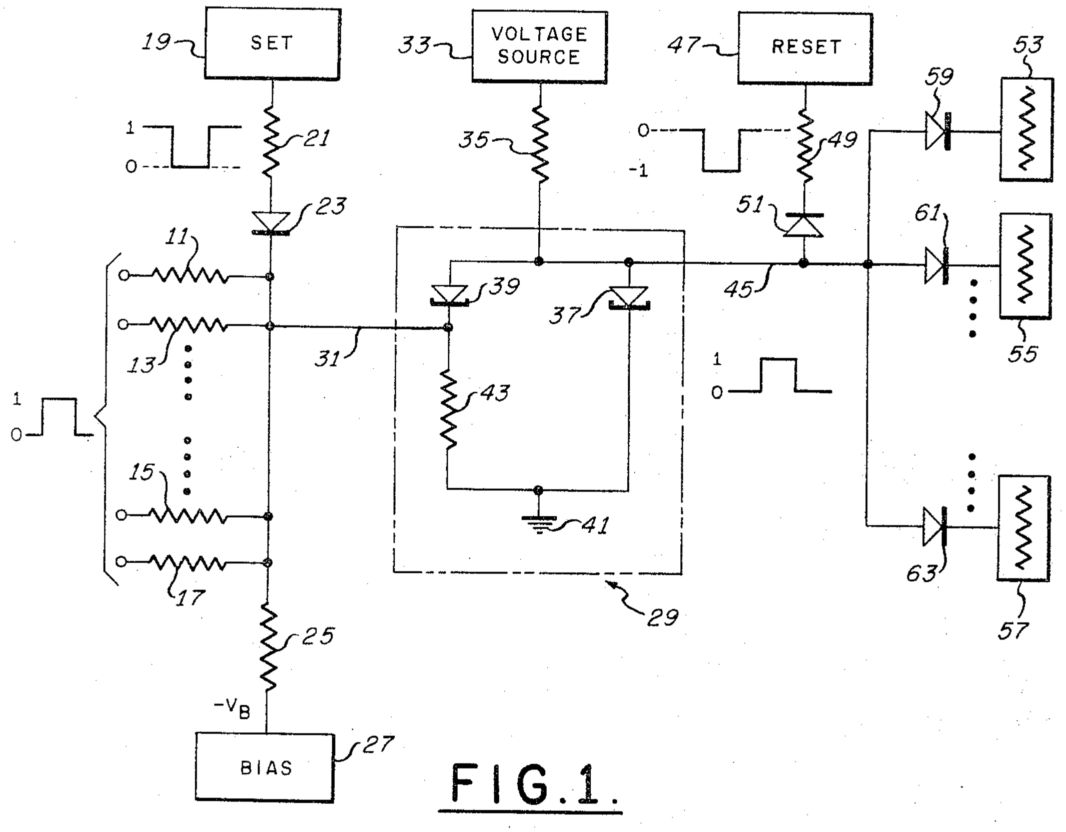
FIG. 1 is a diagram of a circuit embodying the principles of the invention.

Referring now to FIG. 1, a plurality of input resistors 11, 13, 15 and 17 are used to couple input signals to the NOR circuit. A source of SET pulses 19 provides a voltage which normally remains at a positive level sufficient to provide a current approximately equal in magnitude to the magnitude of the positive binary ONE input signals to be received. A pulse from the source 19 occurs when its output drops to a zero level. Voltages from the source 19 are applied through a resistor 21 and a SET diode 23. Signals from the input resistors are conducted to a lead from the SET diode 23 and coupled through a second resistor 25 to a bias source 27. The bias source provides a steady negative voltage designated in the drawing as $-V_B$. Input signals as well as the bias and SET voltages are coupled to a bias controlled tunnel pair 29 through a conductor 31. The bias controlled tunnel pair 29 is energized from a source of positive voltage 33 through a series resistor 35. This positive voltage is applied to a first tunnel diode 37 and a second tunnel diode 39. The first tunnel diode is connected directly to a ground connection 41. The second tunnel diode is connected to the same ground connection through a tunnel pair resistor 43. Output signals are taken from the tunnel pair 29 by means of a conductor 45. A source of RESET pulses 47 is connected through a reset resistor 49 and a reset diode 51 to the conductor 45. The RESET pulse source provides an output voltage that normally remains at a zero voltage level. A RESET pulse consists of a negative-going voltage having an absolute magnitude sufficiently large to provide a current through the resistor 49 and diode 51 that is at least equal to the current provided by the voltage source 33.

The conductor 45 is coupled to individual loads 53, 55 and 57 through individual coupling diodes 59, 61 and 63.

All of the diodes in the circuit except the first and second tunnel diodes 37 and 39 are conventional nontunneling diodes.

The individual loads 53, 55 and 57 are indicated functionally as comprising a single resistive element. Ordinarily, the loads would be formed from additional resistive networks similar to the input networks of the circuit of FIG. 1.

Similarly, although only four input terminals and three output terminals have been depicted, it will be understood that practical circuits usually require many more terminals than the few indicated in the figure.

Figure 2:
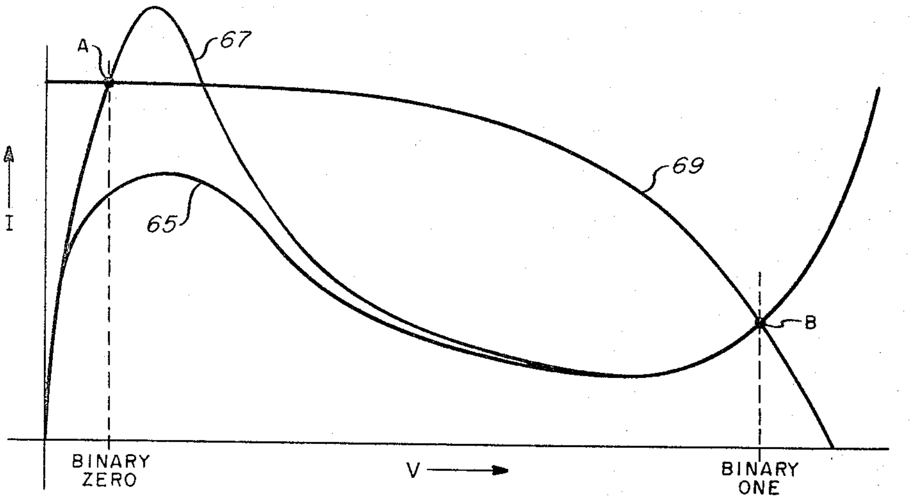
FIG. 2 is a graph illustrating the operating characteristics of the circuit of FIG. 1.

The operation of the circuit can be understood by referring to the graph of FIG. 2 together with the circuit diagram of FIG. 1.

The voltage-current output curve of a bias controlled tunnel pair resembles the characteristic curve of a single tunnel diode. As voltage is increased across the circuit, the current first rises through an initial conductance region to a peak current level. A further increase in applied voltage causes the current to decrease through a negative conductance region to a valley current. Still further increases in voltage cause the current to again rise throughout the diffusion region of the characteristic.

The peak current level attainable in a bias controlled tunnel pair is a function of the input signal applied to the circuit.

The voltage source 33 is adjusted so that the first tunnel diode 37 will operate near its peak current level. The magnitude of the bias source $-V_B$ is adjusted so that the current through the resistor 25 is equal and opposite to the magnitude of the positive-going binary ONE input signals. Thus when a binary ONE input signal is being applied or the output of the SET voltage supply 19 is providing a positive signal, the voltage on the conductor 31 is near ground level. Under these conditions, the current through the diode 39 will also be near its peak current level. The total current, therefore, through the bias controlled tunnel pair will be the sum of these two currents and will be represented as an augmented peak current level at point 67 of the graph of FIG. 2.

When a binary ZERO signal is being applied, however, substantially no signal is applied to the input resistors. When a SET pulse occurs during these conditions, the signal on the conductor 31 drops to a negative value determined by the magnitude of the current from the bias source 27. Since the voltage across the tunnel diode 39 is now increased, this diode is driven beyond its peak current level and into its negative conductance region. The resultant decrease in current through the diode causes a concomitant decrease in total current through the bias controlled tunnel pair. The total current under these conditions now can reach only the suppressed peak current level 65 on the graph of FIG. 2.

The principles of operation of the NOR circuit can be better understood by constructing a load line 69 on the graph of FIG. 2 according to well-known techniques. Since the shape and position of this load line will be influenced by the non-linear characteristics of the coupling diodes, the load line will have a pronounced curvature as indicated. The total load impedance is adjusted so that the load line passes between the augmented and the suppressed peak current levels.

When a voltage is applied to the circuit from the source 33, the circuit currents and voltages will necessarily adjust to a level at which the characteristic curve and the load line intersect.

Thus when a binary ZERO signal is being applied during a SET pulse interval, the current peak level is suppressed and the tunnel pair is switched to a monostable condition. The circuit can operate only at point B on the graph. This is considered the binary ONE state. A relatively low current, high voltage condition obtains with the circuit in this state, so that a relatively high positive voltage is applied to the output conductor 45. If a binary ONE input signal is applied to the circuit, this positive signal enables the current in the tunnel pair 29 to reach an augmented peak current level. This places the circuit in a bistable condition since the characteristic curve intersects the load line at both of the points A and B. Under these circumstances, if the circuit voltage had been reduced to a low value, the circuit would resume operation at point A. This is considered the binary ZERO state of the circuit. A relatively high current, low voltage condition obtains with the circuit in this state so that only an insignificant voltage is applied to the load.

In summary, a positive-going binary ONE input signal that is applied to one or more of the input terminals concurrently with a SET pulse will provide a binary ZERO output signal. A binary ZERO input signal on each input terminal during the occurrence of a SET pulse will provide a positive-going binary ONE output signal. The circuit thus provides logical inversion without phase inversion: binary ONE signals are always represented by positive-going pulses.

RESET pulses are used to release the circuit from the binary ONE state after a signal is processed. SET pulses are used to ensure that the circuit will be capable of switching to the binary ONE state only when a signal is to be processed.

The function of the SET and RESET pulses can be understood by considering the operating procedure. Assume that the circuit is in the binary ZERO state. The SET pulse source 19 provides a steady positive voltage during quiescent periods. This causes an augmented peak current to flow and maintains the circuit in the binary ZERO state.

If, now, a binary ONE input signal is applied to one or more of the input resistors, a SET pulse will have no effect since the positive voltage level originally applied by the SET pulse source will be maintained by the positive binary ONE input signal. Circuit conditions will remain unchanged: the tunnel pair will remain in the binary ZERO state. After the input signal is processed, a RESET pulse is applied. This drops the voltage across the tunnel pair to a low value and transfers the operation to the initial conductance region of the tunnel pair. Since the SET pulse source will be providing a positive voltage at this time, the circuit will again be clamped in the binary ZERO state when current flow through the tunnel pair is re-established upon the termination of the RESET pulse.

When a binary ZERO input signal is applied, the net input voltage on the line 31 drops to a negative value during a SET pulse. The peak current through the tunnel pair drops to the suppressed current level, and the circuit switches to the binary ONE state. The decreased current through the tunnel pair causes a positive-going binary ONE output signal to be applied to the load. The coupling diodes, now exposed to a high voltage, exhibit a low impedance under these conditions so that the load effectively looks back into a low impedance circuit.

After the signal is processed, a RESET pulse is again applied to return the circuit to the binary ZERO state.

The curvature of the load line depicted in FIG. 2 arises because of the nonlinearity of the coupling diodes. The curve is relatively flat in the peak current region. In this region, the tunnel diodes are conducting heavily and provide only a small voltage drop. This small voltage, applied to the coupling diodes, maintains these elements in a high impedance condition so that only insignificant current flow in the load. The total circuit current is relatively insensitive to the number of individual loads. With the tunnel pair in the binary ONE state, however, a high voltage is applied to the coupling diodes, the load current is high, and the coupling diodes present a low impedance to the flow of load current as evidenced by the relatively steep load line in the binary ONE region of the curves of FIG. 2.

Because the position and orientation of the load line is relatively stable in the peak current region, the differential between the augmented and suppressed peak current levels can be minimized with the assurance that the load line will remain between the chosen peak current levels under all operating conditions.

Although the invention is particularly concerned with an improved NOR circuit, it will be appreciated that the same principles can be used to form a NAND circuit by applying the individual inputs to an AND gate and by applying the output of the AND gate to the input conductor 31.

Because the circuit of the invention operates without phase inversion, two or more of the circuits can be connected in direct series relationship without the need for intermediate phase inverters. In such situations, conventional two-phase unconditional reset logic may be employed wherein pairs of SET and RESET pulses are applied alternately to successive circuit stages. This permits a given stage to be switched to a new state in accordance with the signal from a previous stage before the signal from that previous stage is obliterated.

In some instances, negative-going pulses might be desired to indicate a binary ONE. In these instances, the circuit configuration is unchanged, but all of the diodes and the polarities of the various voltage sources are reversed.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. A logic circuit comprising a bias controlled tunnel pair; a nonlinear coupling means to couple the output of said bias controlled tunnel pair to an external load; bias means to clamp the bias controlled tunnel pair in its high voltage state; input means for coupling a train of input signals to said bias controlled tunnel pair, said train including binary ONE signals having an amplitude sufficient to overcome said bias means and binary ZERO signals having substantially zero amplitude; a source of RESET pulses to release the bias controlled tunnel pair from an existing voltage state; and a source of SET pulses to overcome said bias means until a signal is to be processed.

2. A logic circuit comprising a bias controlled tunnel pair having a high current stable state and a low current stable state; bias means to suppress the peak current level of said bias controlled tunnel pair below the level necessary to support the high current stable state; SET means to clamp the bias controlled tunnel pair in the high current stable state until an input signal is to be processed; input means to receive a train of binary coded signals, said train including binary ONE signals having an amplitude sufficient to overcome said bias means and binary ZERO signals having substantially zero amplitude; means to combine said input signals with the output of said bias means whereby a binary ONE input signal permits the circuit to remain in the high current stable state whereas a binary ZERO input signal permits the circuit to switch to the low current stable state; nonlinear coupling means; and output means to connect the logic circuit to an external load through said nonlinear means.

3. A NOR circuit comprising a bias controlled tunnel pair; a series resistor; means to energize said bias controlled tunnel pair through said series resistor; bias means to reduce the maximum current through said bias controlled tunnel pair from an augmented to a suppressed peak current level; signal input means to overcome said bias means in response to a binary ONE input signal; SET pulse means to overcome said bias means until a signal is to be processed; and non-linear diode means to couple the output of said bias controlled tunnel pair to an external load circuit; said series resistor having a value such that a current level intermediate the suppressed and the peak current levels is required to provide the voltage drop necessary to operate the bias controlled tunnel pair in its initial conductance region.

4. A NOR circuit comprising a bias controlled tunnel pair; a series impedance; means to energize said bias controlled tunnel pair through said series impedance; bias means to suppress the peak current level of the bias controlled tunnel pair; input means to couple binary ONE input pulses to the bias controlled tunnel pair, said binary ONE input pulses being sufficient to overcome said bias means; a source of SET pulses, said source providing a quiescent voltage sufficient to overcome said bias means, said source further providing an interruption in the quiescent voltage when an input signal is to be processed; and non-linear diode means to couple the bias controlled tunnel pair to an external load; said series impedance having a value such that it requires a current greater than the suppressed current level to maintain the bias controlled tunnel pair in its initial conductance region.

5. A NOR circuit comprising a voltage source; a series resistor connected to the output of said voltage source; a bias controlled tunnel pair connected between the output of said series resistor and ground; bias means to suppress the peak current level of said bias controlled tunnel pair; signal input means to cancel said bias in response to a binary ONE input signal whereby the current through the bias controlled tunnel pair is allowed to reach an augmented peak current level during the processing of a binary ONE signal; an output circuit connected to said bias controlled tunnel pair; nonlinear coupling means in said output circuit; said series resistor having a resistance such that its characteristics can be represented by a load line passing intermediate the augmented and suppressed current levels of the bias controlled tunnel pair; and an output terminal on said coupling means for connecting the NOR circuit to an external load.

6. A NOR circuit comprising a bias controlled tunnel pair; first and second tunnel diodes in said bias controlled tunnel pair; a series resistor connected between said voltage source and said bias controlled tunnel pair; bias means to suppress the peak current level of said bias controlled tunnel pair; signal input means to cancel said bias in response to a binary ONE input signal whereby the current through the bias controlled tunnel pair is allowed to reach an augmented peak current level during the processing of the binary ONE input signal; an output circuit connected to the junction of said series resistor and the bias controlled tunnel pair; a solid state coupling diode in said output circuit, said coupling diode being oriented so that one of its elements is connected to the like element on said first tunnel diode; and an output terminal on said coupling diode for connecting the NOR circuit to a desired load.

7. A NOR circuit comprising a bias controlled tunnel pair; a series resistor; means to energize the bias controlled tunnel pair through said resistor; bias means to clamp the bias controlled tunnel pair in its monostable condition; input means to couple binary ONE input signals to the bias controlled tunnel pair, said binary ONE signals having an amplitude and polarity sufficient to overcome said bias means thereby returning the bias controlled tunnel pair to its bistable condition; a source of SET pulses coupled to the bias controlled tunnel pair, said source providing a quiescent voltage having an amplitude and polarity sufficient to overcome said bias means thereby returning the bias controlled tunnel pair to its bistable condition, said source further providing interruptions in said quiescent voltage to permit the processing of an input signal; RESET pulse means for temporarily reducing the voltage across the bias controlled tunnel pair after a signal is processed whereby the circuit may be returned to its lower voltage stable condition in preparation for the subsequent operation; a nonlinear coupling diode connected at the junction of said series resistor and the bias controlled tunnel pair; and means to couple an external load to the NOR circuit through the diode.

8. A NOR circuit comprising a source of supply voltage; a series resistor; a bias controlled tunnel pair connected to receive energy from said source through said resistor; a bias voltage supply to suppress the peak current level of said bias controlled tunnel pair; means to receive binary ONE input signals, said input signals having an amplitude equal but opposite to the voltage from said bias voltage supply; means to couple binary ONE input signals to said bias controlled tunnel pair whereby a binary ONE input signal can cancel the effect of said bias supply so as to augment the peak current level of said bias controlled tunnel pair; a source of SET pulses coupled to said bias controlled tunnel pair, said SET pulse source providing a quiescent voltage equal but opposite to said bias voltage, said SET pulse source further providing interruptions in said quiescent voltage whenever an input signal is to be processed so as to augment the peak current level of the bias controlled tunnel pair during quiescent periods; and a diode to couple the output of the bias controlled tunnel pair to an external load; said series resistor having a value such that it may be represented by a load line intermediate the suppressed and augmented peak current levels.

9. A NOR circuit comprising a bias controlled tunnel pair; a series resistor; means to energize said bias controlled tunnel pair through said series resistor; a source of bias voltage coupled to said bias controlled tunnel pair, said bias voltage having a polarity and amplitude sufficient to suppress the peak current level of the bias controlled tunnel pair; said series resistor having a value such that the suppressed peak curent level is insufficient to permit operation of the bias controlled tunnel pair in its initial conductance region; input means to couple binary ONE input signals to said bias controlled tunnel pair; a source of SET pulses, said source providing a steady voltage during quiescent periods, said source further providing an interruption in the steady voltage when an input signal is to be processed; said binary ONE input voltage and said steady voltage each having an amplitude at least as great as said bias voltage and a polarity opposite to said bias voltage whereby the bias voltage can suppress the peak current level only in the absence of a binary ONE input signal and in the absence of a steady voltage from said SET pulse source; a nonlinear diode coupling means connected to the junction of said series resistor and the bias controlled tunnel pair; and means to couple an external load to the NOR circuit through said diode.

10. A logic circuit comprising a bias controlled tunnel pair having a high current stable state and a low current stable state; bias means to suppress the peak current level of said bias controlled tunnel pair below the level necessary to support the high current stable state; a source of voltage; a series resistor interconnecting said source of voltage and said bias controlled tunnel pair; SET means to clamp the bias controlled tunnel pair in the high current stable state until an input signal is to be processed; input means to receive a train of binary coded signals, said train including binary ONE signals having an amplitude sufficient to overcome said bias means and binary ZERO signals having substantially zero amplitude; means to combine said input signals with the output of said bias means whereby a binary ONE input signal permits the circuit to remain in the high current stable state whereas a binary ZERO input signal permits the circuit to switch to the low current stable state; a nonlinear coupling diode connected to the junction of said series resistor and said bias controlled tunnel pair, said diode having an impedance that decreases with increasing current flow; and output means for connecting an external load to the bias controlled tunnel pair through said coupling diode whereby the voltage applied to the series combination of the load and the diode is essentially the same as the voltage applied to the bias controlled tunnel pair.

11. A logic circuit comprising a bias controlled tunnel pair; a series resistor; a source of power connected to energize said bias controlled tunnel pair through said series resistor, said series resistor having a value such that its load line intersects the characteristic curve of the bias controlled tunnel pair in the initial conductance region and in the diffusion region so as to provide a bistable circuit; bias means to suppress the peak current level of the bias controlled tunnel pair so that the load line intersects the characteristic curve only in the diffusion region thereby providing a monostable circuit; input means to couple binary ONE input signals into the bias controlled tunnel pair; a source of SET pulses coupled to said bias controlled tunnel pair, said SET pulse source providing a steady voltage during quiescent periods, said SET pulse source further providing interruptions in said steady voltage to enable the processing of an input signal; said binary ONE input signals and said steady voltage having amplitudes that are equal and opposite to the output of said bias means whereby either of these voltages can overcome the bias means and restore the circuit to the bistable condition; RESET means for temporarily reducing the voltage across said bias controlled tunnel pair after one signal is processed whereby the circuit is returned to its lower voltage bistable state before the subsequent signal is processed; nonlinear diode coupling means connected to the junction of said series resistor and the bias controlled tunnel pair; and an output terminal on said diode means for connecting the circuit to an external load whereby a high voltage is applied to the load only when the circuit is operating in the monostable condition.

12. A NOR circuit comprising:

(a) a source of positive voltage, (b) a series resistor connected to the output of said positive voltage source, (c) a bias controlled tunnel pair containing a first tunnel diode having its anode connected to the series resistor and its cathode grounded, a second tunnel diode having its anode connected to the series resistor, and a tunnel pair resistor connected between the cathode of said second tunnel diode and ground, (d) a bias source of negative voltage, (e) a source of SET pulses, said source providing a quiescent positive voltage equal in magnitude to the magnitude of the binary ONE input signals to be received, said source further providing SET pulses in which the voltage drops to substantially zero level, (f) input means to receive positive-going binary ONE input signals, (g) means to combine the input signals, the bias source voltage, and the SET pulses, (h) means to couple the resultant voltage from said combining means to the junction of said second tunnel diode and said tunnel pair resistor, (i) said bias source providing a negative voltage of sufficient magnitude to drive the second tunnel diode into its negative conductance region whereby a SET pulse unaccompanied by a binary ONE input signal will suppress the peak current level of the bias controlled tunnel pair whereas a SET puse accompanied by a binary ONE input signal will augment the peak current level of the bias control tunnel pair, (j) a source of negative-going RESET pulses coupled to the anodes of the tunnel diodes, said RESET pulses having sufficient magnitude to drive the tunnel diodes into their initial conductance region, (k) a coupling diode having its anode connected to the anodes of the tunnel diodes, and (l) an output terminal on said coupling diode for connecting an external load to the NOR circuit, (m) said series resistor having a value such that the maximum current through this resistor is intermediate the suppressed and augmented peak current levels of the tunnel pair.

References Cited

UNITED STATES PATENTS 3,217,180 11/1965 Bergman ---------- 307—88.5

OTHER REFERENCES

Carr et al.: "Bias-Controlled Tunnel-Pair Logic Circuits," I.R.E. Transactions On Electronic Computers, EC–11, No. 6, December 1962, (pp. 773–779 relied on).

ARTHUR GAUSS, *Primary Examiner.*

D. D. FORRER, *Assistant Examiner.*